United States Patent [19]

Lee et al.

[11] Patent Number: 4,975,777
[45] Date of Patent: Dec. 4, 1990

[54] CHARGE-COUPLED IMAGER WITH DUAL GATE ANTI-BLOOMING STRUCTURE

[75] Inventors: Teh-Hsuang Lee, Webster; Herbert J. Erhardt, Rochester, both of N.Y.

[73] Assignee: Eastman Kodak Company, Rochester, N.Y.

[21] Appl. No.: 366,843

[22] Filed: Jun. 15, 1989

[51] Int. Cl.$^5$ .............................................. H04N 3/14
[52] U.S. Cl. ............................ 358/213.19; 358/213.31
[58] Field of Search .................... 358/213.19, 228, 909, 358/213.26, 213.31, 213.23

[56] References Cited

U.S. PATENT DOCUMENTS

| | | | |
|---|---|---|---|
| 4,242,599 | 12/1980 | Suzuki | 307/311 |
| 4,686,572 | 8/1987 | Takatsu | 358/213.19 |
| 4,716,466 | 12/1987 | Miida et al. | 358/213.26 |
| 4,743,778 | 5/1988 | Takatsu et al. | 358/213.19 |
| 4,851,915 | 7/1989 | Yang et al. | 358/213.19 |
| 4,912,560 | 3/1990 | Osawa et al. | 358/213.19 |

FOREIGN PATENT DOCUMENTS 58-220573 12/1983 Japan.
59-80070 5/1984 Japan.

Primary Examiner—Stephen Brinich

[57] ABSTRACT

A CCD imager includes a substrate of a semiconductor material having a plurality of photodetectors therein at a top surface thereof and arranged either in a line or in an array of rows and columns. A CCD shift register is in the substrate along but spaced from one side of the line or each column of photodetectors. Between each photodetector and its adjacent shift register is an accumulation region. A transfer gate is provided between the shift register and its adjacent line or column of accumulation regions. A transfer gate is provided between each line or row of photodetectors and the adjacent accumulation regions. A first anti-blooming drain region is provided along each line or column of photodetectors on the side of the photodetectors opposite the accumulation regions. A separate second anti-blooming drain is provided along a side of each accumulation region in the area of the substrate between the shift register and the photodetectors. During the integration stage of the imager while charge carriers generated in the photodetectorsa are being collected and stored in the accumulation regions, any excess charge carriers flow into the second anti-blooming drains to prevent blooming into the shift register. During the transfer stage when the charge carriers are being transferred to the shift register, excess charge carriers generated in the photodetectors flow into the first anti-blooming drain to prevent blooming in the shift register during the transfer stage.

28 Claims, 4 Drawing Sheets

CHARGE-COUPLED IMAGER WITH DUAL GATE ANTI-BLOOMING STRUCTURE

FIELD OF THE INVENTION

The present invention relates to a charge-coupled device (CCD) imager, and more particularly to a CCD imager having a dual gate anti-blooming structure which effectively suppresses blooming both during scene integration and during transfer to the read-out structure.

BACKGROUND OF THE INVENTION

CCD imagers in general include a plurality of photodetectors arranged in rows and columns and CCD shift registers arranged between the rows of the photodetectors. The photodetectors in each row are coupled, such as by a transfer gate, to their adjacent CCD shift register so that the charge carriers accumulated in the photodetectors can periodically be transferred to the CCD shift register. The CCD shift register transfers the charge carriers to the read-out of the device. It has been found that if a photodetector accumulates an excessive amount of the charge carriers prior to their being transferred to the CCD shift register, some of the charge carriers will overflow from the photodetector into the CCD shift register and/or adjacent photosites. This adversely affects the charge carriers in the shift register being transferred to the read-out structure. This effect is referred to as "blooming".

Conventional techniques for preventing blooming, i.e. anti-blooming techniques, use an overflow drain between the photodetector and the adjacent CCD shift register with the drain being isolated from the photodetector by a potential barrier. The height of the barrier is controlled either by a diffusion or by a separate gate. During integration, the charge in the photodetector builds up as a result of the impinging radiation. If the charge level in the photodetector reaches a sufficient amount to raise the photodetector potential to a level above that of the barrier between the photodetector and the overflow drain, additional signal carriers will be swept over into the anti-blooming drain where they are removed by the drain supply. This prevents excess charge from flowing into the CCD shift register and thereby prevents blooming. During this integration period, the charge in the photodetector is isolated from the CCD shift register by a transfer gate which is held at a potential high enough to form a barrier to the carriers higher than the anti-blooming drain barrier. During the transfer period, the transfer gate barrier is lowered allowing the charge to flow from the photodetector into the CCD shift register. However, a problem with this anti-blooming structure may arise under high exposure conditions. During the transfer operation, there is not only a flow of the charge from the photodetector to the CCD shift register, but also a flow of any excess charge directly into the CCD shift register. If the total amount of charge is greater than the charge capacity of the shift register cell, the result is a similar effect as if blooming had occurred from the photodetector itself during the integration stage. Therefore, it is desirable to have an anti-blooming structure which prevents blooming not only during the integration stage, but also during the transfer stage.

SUMMARY OF THE INVENTION

The present invention relates to a CCD imager which includes at least one photodetector having an anti-blooming drain adjacent thereto and a CCD shift register adjacent thereto on the side opposite the anti-blooming drain. Between the photodetector and the CCD shift register is an accumulation region having an anti-blooming drain adjacent thereto. Transfer gates are provided between the photodetector and the accumulation region and between the accumulation region and the CCD shift register. The anti-blooming drain adjacent the accumulation region receives any excess charge carriers generated during integration, and the anti-blooming drain adjacent the photodetector receives any excess charge carriers generated in the photodetector during the transfer of the charge carriers from the accumulation region to the CCD shift register. Accordingly, blooming is prevented in the shift register both during the integration stage and during the transfer stage.

Thus, the CCD imager of the present invention includes a substrate of a semiconductor material having a major surface and a photodetector in the substrate at the major surface. An anti-blooming drain region is in the substrate adjacent a side of the photodetector. A charge-coupled device shift register is at the major surface along the side of the photodetector opposite the anti-blooming drain. An accumulation region is at the major surface between the photodetector and the shift register. Means is provided for transferring charge from the photodetector to the accumulation region and means is provided for selectively transferring charge from the accumulation region to the shift register. A separate anti-blooming drain is provided in the substrate at the major surface along one side of the accumulation region. This permits charge to be transferred from the accumulation region to the shift register without transferring any excess charge from the photodetector to the shift register during the transfer stage.

The invention will be better understood from the following more detailed description taken with the accompanying drawings and claims.

Figure 1:
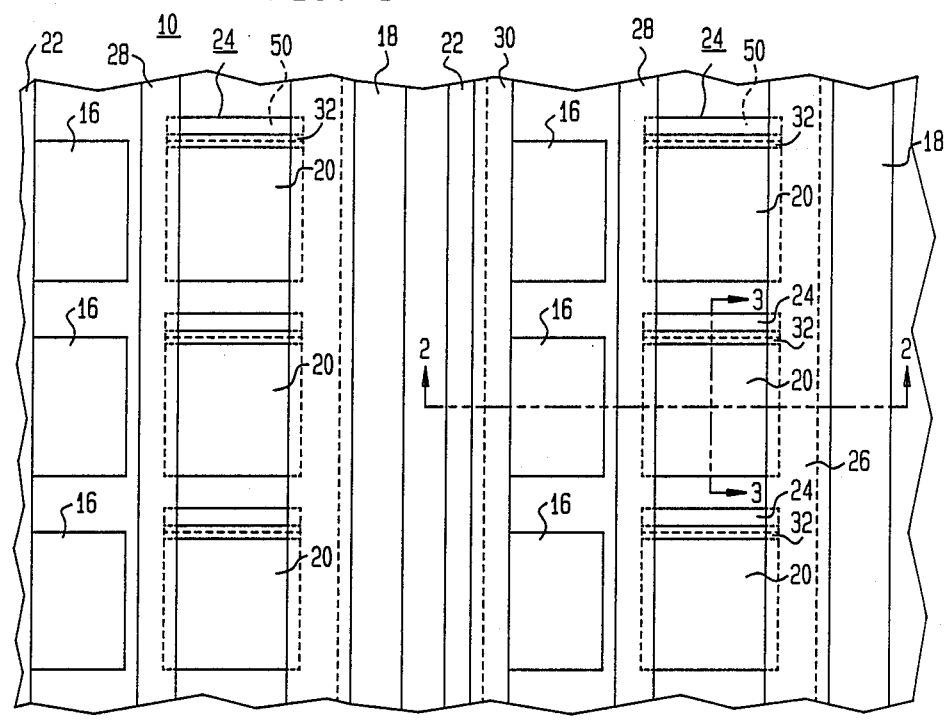
FIG. 1 is a top plan view of a portion of a CCD imager in accordance with the present invention.

It should be understood that the various FIGS. of the drawing are not necessarily drawn to scale.

DETAILED DESCRIPTION

Figure 2:
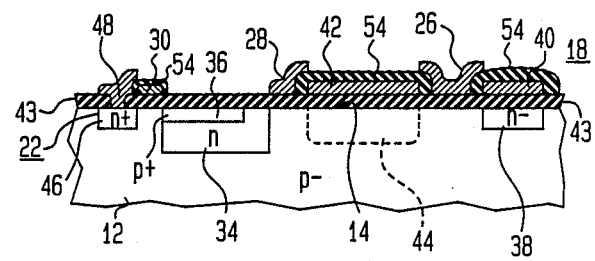
FIG. 2 is a sectional view of a portion of the imager taken along line 2—2 of FIG. 1.
Figure 3:
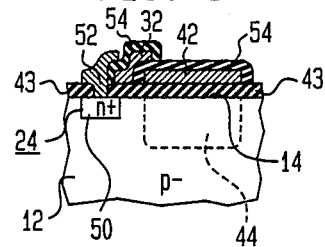
FIG. 3 is a sectional view of a portion of the imager taken along line 3—3 of FIG. 1.

Referring now to FIGS. 1, 2 and 3, there is shown a CCD imager 10 in accordance with the present invention. FIG. 2 is a cross sectional view of a portion of FIG. 1 taken along the dashed line 2—2. FIG. 3 is a cross sectional view of another portion of FIG. 1 taken along the dashed line 3—3. Imager 10 comprises a substrate (semiconductor body) 12, typically of a semiconductor material, such as p-type single crystalline silicon, having a major (top) surface 14. In the substrate 12 along the major surface 14 are a plurality of photodetectors 16. As shown, the photodetectors 16 are arranged in spaced rows and columns to form an area array imager. However, the photodetectors 16 may be arranged in a single row to form a line imager. Extending between the columns of the photodetectors 16 and substantially parallel to each column thereof is a CCD shift register 18. Thus, each shift register 18 extends along one side of each of the photodetectors 16 in a respective column. Between each of the photodetectors 16 and its respective CCD shift register 18 is an accumulation region 20. Along and spaced from the sides of the photodetectors 16 in each column opposite the sides adjacent the accumulation regions 20 is a first anti-blooming drain 22 which extends along and substantially parallel to the entire column of the photodetectors 16. A separate second anti-blooming drain 24 extends along and is spaced from a side of each accumulation region 20 so as to extend along the space between the CCD shift reigster 18 and the column of photodetectors 16.

A transfer gate 26 extends across the space between the CCD shift register 18 and the column of accumulation regions 20 along the entire column of the accumulation regions 20 which that shift register 18 is in charge transfer relation with accumulation regions 20. A transfer gate 28 extends across the space between each column of accumulation regions 20 and its adjacent column of photodetectors 16 along the entire length of the column such that the accumulation regions 20 are in charge transfer relation with the respective photodetectors 16. A gate 30 extends along the space between each row of the photodetectors 16 and their adjacent anti-blooming drain 22 along the entire column of the photodetectors 16, and a separate gate 32 extends along the space between each accumulation region 20 and its adjacent anti-blooming drain 24. Thus the photodetectors 16 are in charge transfer relation to the anti-blooming drain 22 and each accumulation region 20 is in charge transfer relation with its respective anti-blooming drain 24.

As shown in FIG. 2, each photodetector 16 is a photodiode of the type which includes an n-type conductivity region 34, (shown as n) in the substrate 12 at the major surface 14. Typically the conductivity of region 34 is about $10^{17}$ impurities/cm$^3$. The substrate 12 is preferably of p/type conductivity (shown as p−), typically of $10^{15}$ impurities/cm$^3$, or can have a p-type well in the surface 14 of an n-type conductivity substrate in which the photodiode is formed. A second, highly conductive, p-type conductivity region 36 (shown as p+), typically of a conductivity of $10^{18}$ impurities/cm$^3$, exists within a portion of the first region 34 at the substrate surface 14. Regions 12, 34 and 36 form a pinned or buried diode. However, instead of the photodiode 16 shown, any other known type of photodetector, such as a Schottky barrier photodiode or simple pn junction diode, can be used.

The CCD shift register 18 may be of any well known construction. A buried channel configuration is shown in FIG. 2. The shift register 18 comprises an n-type conductivity channel region 38 (shown as n−) of impurity concentration of about $10^{17}$ impurities/cm$^3$ in the substrate 12 at the surface 14. The channel region 38 extends along the surface 14 spaced from and parallel to the column of the photodetectors 16. Over the channel region 38 are a plurality of conductive gates 40 which are spaced along the channel region 38. The gates 40 may be made of a metal or conductive polycrystalline silicon. The gates 40 are spaced and are insulated from the substrate surface 14 by a layer 43 of a dielectric, typically silicon oxide, which extends across the substrate surface 14. The gates 40 are connected by bus lines (not shown) to a potential source (not shown) for selectively applying a potential to the gates 40 to operate the shift register 18.

Each of the accumulation regions 20 is formed by a gate 42 of a conductive material, such as a metal or conductive polycrystalline silicon. Each accumulation gate 42 is on the silicon oxide layer 43 over the space between a photodetector 16 and the CCD shift register 18. The accumulation gates 42 are connected by a bus line (not shown) to a source of potential (not shown) so that each accumulation gate 42 will create a potential well, indicated by dashed line 44, in the substrate 12 beneath the gate 42.

The first anti-blooming drain 22 is a region 46 of n/type conductivity (shown as n+) and of a conductivity of about $10^{19}$ impurities/cm$^3$ in the substrate 12 and extending to the surface 14. The region 46 extends along the entire length of the column of photodetectors 16 spaced from the photodetectors. The drain region 46 is connected to a source of potential (not shown) through a conductive contact 48.

As shown in FIG. 3, each of the second anti-blooming drains 24 is a region 50 of n-type conductivity (shown as n+) in the substrate 12 at the surface 14. Each drain region 50 extends along a side of its respective accumulation region 20 along the space between the CCD shift register 18 and the column of photodetectors 16. The drain regions 50 are connected to a source of potential through conductive contacts 52 and a bus line (not shown).

Each of the transfer gates 26, 28, 30 and 32 is a strip of a conductive material, such as a metal or conductive polycrystalline silicon, which is on the silicon oxide layer 43. The transfer gate 26 extends over the space between the shift register 18 and the column of accumulation regions 20 and overlaps both the shift register gates 40 and the accumulation gates 42. The transfer gate 26 is insulated from the shift register gates 40 and the accumulation gates 42 by a layer 54 of silicon oxide which covers the shift register gates 40 and accumulation gates 42. The transfer gate 28 extends across the space between the column of photodetectors 16 and column of accumulation regions 20 along the full length of the columns. The transfer gate 28 overlaps the accumulation region gates 42 and is insulated therefrom by the silicon oxide layer 54. The anti-blooming drain gate 30 extends across the space between the anti-blooming drain region 46 and the column of photodetectors 16 along the full length of the column. The gate 30 overlaps the anti-blooming drain region 46. As shown in FIG. 3, each of the accumulation regions to anti-blooming drain gates 32 extends across the space between its respective accumulation region gate 42 and anti-blooming drain region 50 and overlaps each.

In the operation of imager 10, a potential is applied to each of the accumulation gates 42 so as to induce a potential well 20P of a depth greater than the potential well 16P of the photodetectors 16. The maximum potential of well 16P is determined by the doped layers 12, 34 and 36. A discussion of this relationship is given in the article entitled "The Pinned Photodiode For An Inter-Transfer CCD Image Sensor," by B. C. Burkey et al, IEDM Technical Digest, 1984, page 28. Potentials are also applied to the anti-blooming drain regions 46 and 50 to create potential wells 46P and 50P respectively which are deeper than the potentials 16P and 20P of the photodetectors 16 and accumulation regions 20 respectively. This can be seen in the potential diagrams shown in FIGS. 4A and 4B respectively. Also, a constant potential can be applied to the gates 32 between the second anti-blooming drains 24 and the accumulation regions 20 to provide a fixed potential level 32P therebetween. The potential level 32P is set at a level which will determine the minimum potential level to be reached in the accumulation regions 20.

Figure 4A:
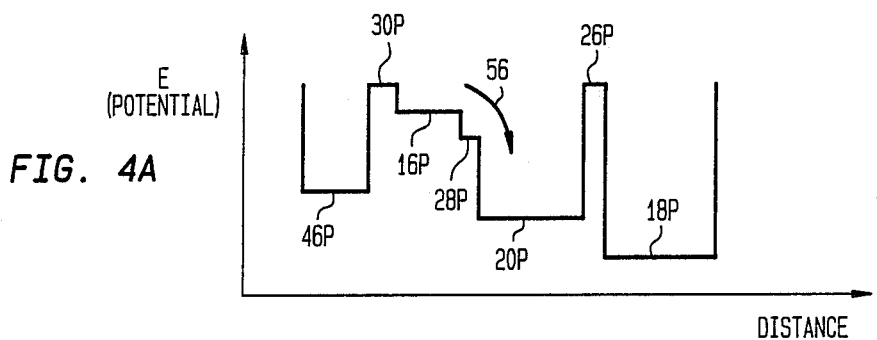
FIGS. 4A and 4B are potential diagrams of the imager during integration taken along the sections of FIGS. 2 and 3 respectively.
Figure 4B:
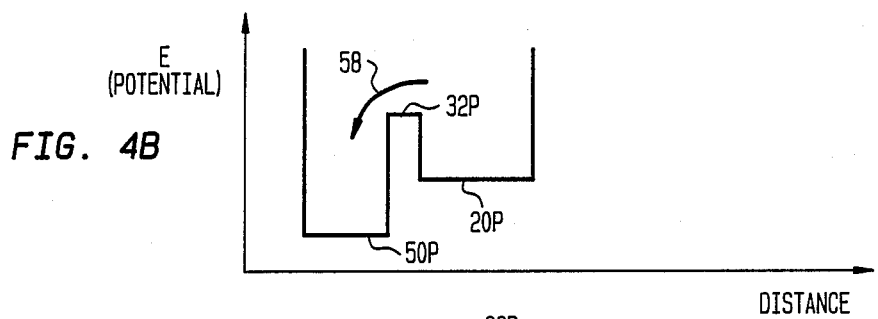

During a scene integration period, radiation impinging on the photodetectors 16 is converted to charge carriers. A potential is applied to the gate 28 between the photodetectors 16 and the accumulation regions 20 which creates a potential well 28P deeper than the potential level 16P in the photodetectors 16 but not as deep as the potential level 20P in the accumulation regions 20 as shown in FIG. 4A. Thus, charge carriers generated in the photodetectors 16 will diffuse and/or drift into the accumulation regions 20 as indicated by the arrow 56 in FIG. 4a. The charge carriers will then be stored in the accumulation regions 20. As charge accumulates in the accumulator regions 20, the potential level is shifted accordingly. If the potential level remains below that of the potential of the gate 32, all of the charge carriers are stored in the accumulation region 20 until they are transferred to the CCD shift register 18. However, if the potential level in the accumulation region 20 reaches the potential level of the gate 32, any additional charge will be drained into the anti-blooming drain 24 as indicated by the arrow 58 in FIG. 4B. Thus, the undesired flow of charge carriers from the accumulation region 20 to the CCD shift register or adjacent photosites is prevented so as to limit blooming.

Figure 5A:
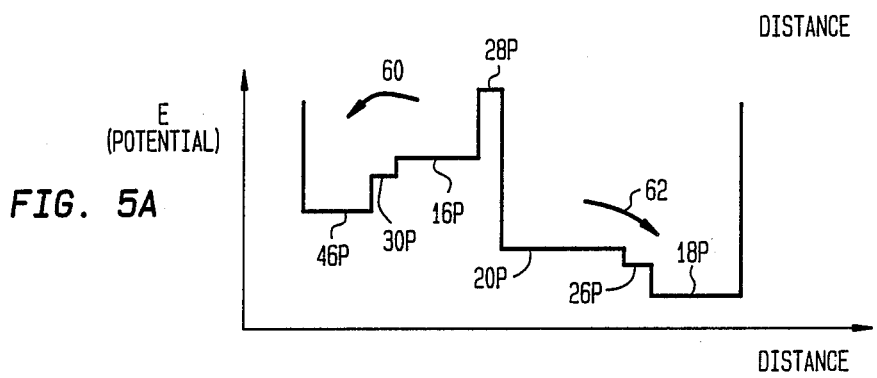
FIGS. 5A and 5B are potential diagrams of the imager during transfer taken along the sections of FIGS. 2 and 3 respectively.
Figure 5B:
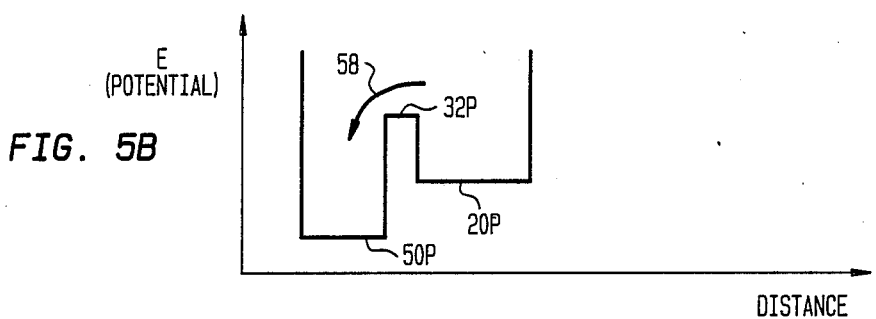
Figure 9:
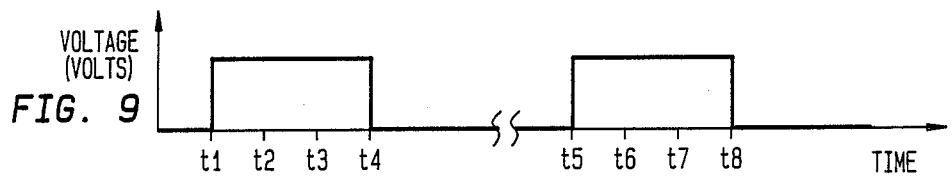
FIGS. 9, 10 and 11 are timing diagrams of the operation of the imager of the present invention.
Figure 10:
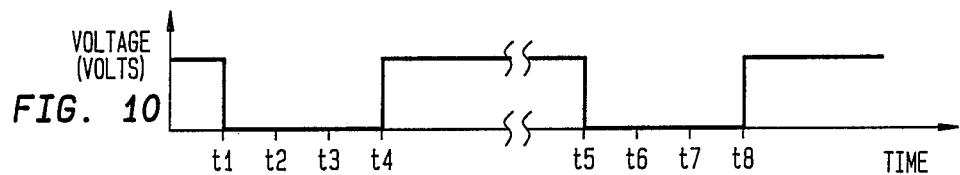
Figure 11:
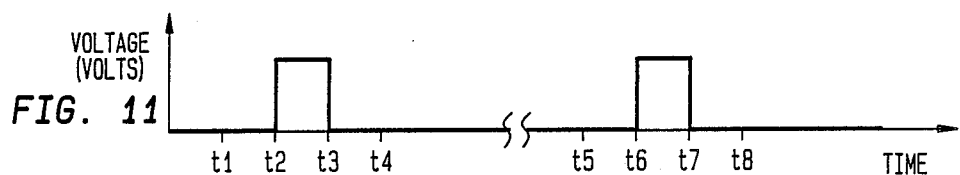

During the period of transfer from the accumulation regions 20 to the CCD shift register 18, at time t1, a potential is applied to the gate 30 between the photodetectors 16 and the anti-blooming drains 22 as indicated in the timing diagram of FIG. 9. This lowers the barrier 30P between the photodetectors 16 and the first anti-blooming drains 22 as shown in FIG. 5A. At the same time, t1, the potential applied to the gate 28 between the photodetectors 16 and accumulation regions 20 is turned off as shown in FIG. 10. This raises the barrier 28P between the photodetectors 16 and the accumulation regions 20 as shown in FIG. 5A. Thus, any charge carriers which may be generated in the photodetectors 16 will be prevented from reaching the accumulation region and instead be drawn off to the first anti-blooming drain 22. By clocking gate 30 in this manner, the anti-blooming drain 22 is used as an exposure control, as well as an anti-blooming structure. Alternatively, gate 30 could be held at a constant bias to allow anti-blooming drain 22 to function simply to prevent blooming. After the potential to the gate 30 has been turned on and the potential to the gate 28 is turned off, a potential is applied to the CCD shift register transfer gate 26 at time t2, as indicated by FIG. 11. As shown in FIG. 5A, this lowers the potential barrier 26P between the accumulation regions 20 and the CCD shift register 18 so that the carriers flow from the accumulation regions 20 into the channel 38 of the shift register 18, as indicated by arrow 62, where they are transferred to the imager read-out. Thus, during the transfer stage, excess carriers generated in the photodiodes are prevented from flowing into the shift register but are carried into the anti-blooming drain 22.

Figure 12:
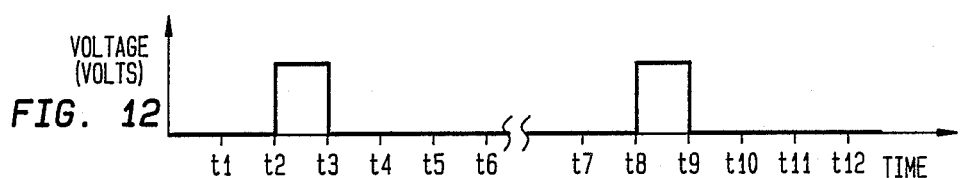
FIGS. 12, 13 and 14 are timing diagrams of another method of operating the imager of the present invention.
Figure 13:
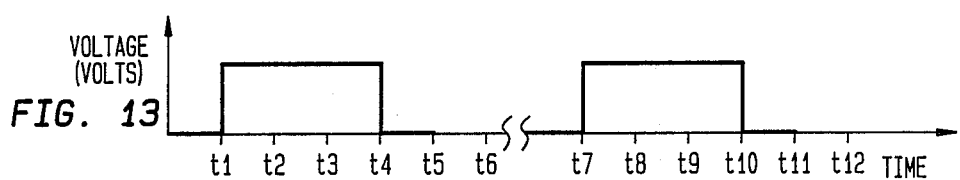
Figure 14:
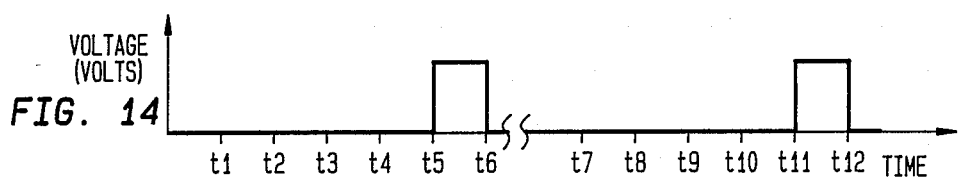

FIGS. 12, 13 and 14 illustrate the timing during transfer for a method of operating the imager 10 so as to accumulate the generated charge carriers in the photodetectors 16 before transferring the carriers to the accumulator regions 20. For this method of operation, the potential to the gate 32 is turned on first at time t1, as shown by FIG. 13. Then at time t2, the potential to the gate 28 is turned on as indicated by FIG. 12. This lowers the potential barrier 30P between the photodetectors 16 and the accumulation region 20 so as to allow carriers accumulated in the photodetectors to flow into the first accumulation region 20. After the carriers have transferred to the accumulation region 20, the potential to the transfer gate 28 is turned off at time t3, as indicated by FIG. 12 to prevent any other carriers from flowing into the accumulation regions 20. At time t5 (as shown in FIG. 14) the transfer gate 26 is turned "on" and thus allows the carriers to flow from the accumulation region 20 to the channel 38 of the shift register 18, for subsequent readout. This provides for a photodetector storage rather than an accumulation region storage, while still maintaining anti-blooming control. As another option, gate 32 could be kept at a dc bias instead of being clocked. This dc bias level would be selected so as to keep potential 32P at an optimum level to prevent anti-blooming.

In the imager 10 shown in FIGS. 1, 2 and 3, the accumulation gates 42, transfer gate 32 between the anti-blooming drain 50 and accumulation region 42, and anti-blooming region contact 52 are separate layers of a conductive material requiring separate terminals. Thus, there are three terminals for these gates and contacts.

Figure 6:
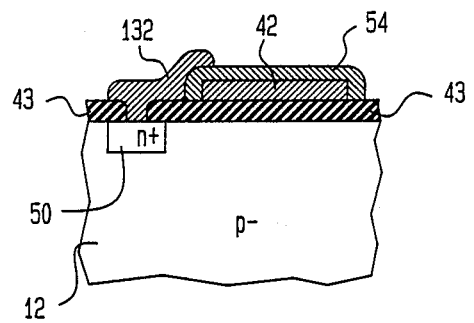
FIGS. 6, 7 and 8 are sectional views of modifications of the imager of the present invention.

Referring now to FIG. 6, there is shown a modification of the imager 10 wherein electrode 132 between the accumulation gate region 42 and the anti-blooming region 50 extends over and makes contact to the anti-blooming drain region 50. Thus, the electrode 132 serves the dual function of a contact to region 50 of the anti-blooming drain 24 and of a transfer gate between the accumulation region and the anti-blooming drain 24. Therefore, only two terminals are required.

Figure 7:
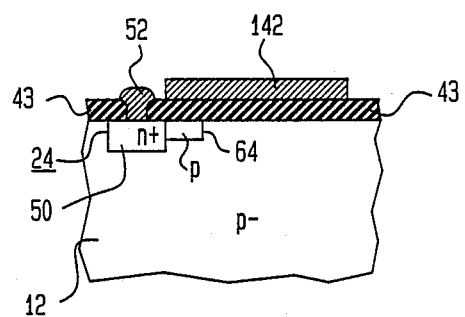

Referring to FIG. 7, there is shown a modification of the imager in which an accumulation region gate 142 extends up to the edge of the anti-blooming drain region 50. A region 64 of p-type conductivity (shown as p) and of impurity concentration of about $10^{16}$ impurities/cm$^3$ is provided in the substrate 12 and the surface 14 between the anti-blooming drain region 50 and the accumulation region 20. Thus, the gate 142 serves to form both the accumulation region well and the potential barrier between the accumulation region 20 and the anti-blooming drain 24. Although the gate 142 has only a single potential applied thereto, the doping of the region 64 is used to adjust the height of the potential barrier formed between the accumulation region 20 and the anti-blooming drain 24.

Figure 8:
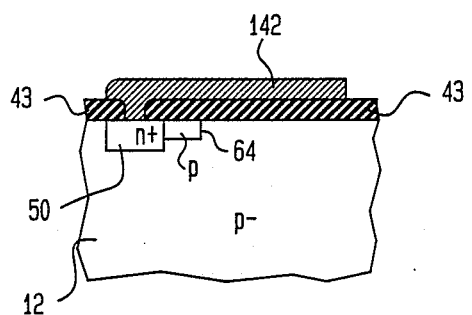

Referring to FIG. 8, there is shown a modification of the imager wherein the accumulation gate 142 also makes contact to the anti-blooming drain region 50. Thus, the single gate 142 serves the three functions of being the means to apply a potential to the anti-blooming drain region 50, the means for adjusting the potential barrier between the accumulation region 20 and the anti-blooming drain region 50 and the gate of the accumulation region 20. This structure also has the advantage that it requires only a single terminal.

Thus there is provided by the present invention a CCD image array which includes an accumulator region between each photodetector and the CCD shift register with the photodetector and each accumulation region having its own anti-blooming drain. The charge carriers which are generated in the photodetector during the integration stage are transferred to the accumulation region where they are stored until the transfer stage when the carriers are transferred to the CCD shift register. Any excess of carriers in the accumulation region will flow into the accumulation region's anti-blooming drain to prevent blooming in the CCD shift register. Moreover, during the transfer stage, a barrier is provided between the photodetector and the accumulation region so that any excess carriers generated in the photodetector will flow into the photodetector's anti-blooming drain and will now flow into the CCD shift register. Thus, blooming into the CCD shift register is prevented both during the integration stage and the transfer stage. A second implementation, allows for storage of the signal carriers in the photodetector prior to the transfer to the shift register, while maintaining anti-blooming control during integration and transfer.

What is claimed is:

1. A charge-coupled imager comprising:
   a substrate of a semiconductor material having a major surface:
   a photodetector in said substrate at said major surface;
   a first anti-blooming drain region in said substrate adjacent and along one side of the photodetector;
   a CCD shift register at said surface along a side of said photodetector opposite the first anti-blooming drain;
   an accumulation region at said surface between said photodetector and the shift register;
   first means for transferring charge carriers from said photodetector to said accumulation region;
   second means for transferring charge carriers from said accumulation region to said shift register; and
   a second anti-blooming drain region in said substrate at said surface and along a side of said accumulation region.

2. The charge-coupled device of claim 1 in which the second anti-blooming drain region along the accumulation region extends along a space between the shift register and the photodetector.

3. The charge-coupled device of claim 2 further comprising means between the accumulation region and the second anti-blooming drain region for controlling the potential barrier between the accumulation region and the second anti-blooming drain region.

4. The charge-coupled device of claim 3 further comprising means between the photodetector and the first anti-blooming drain region for controlling the potential barrier between the photodetector and the first anti-blooming drain region.

5. The charge-coupled device of claim 4 in which the accumulation region includes a conductive gate over and insulated from a portion of the portion of the major surface between the photodetector and the shift register, said gate being adapted to be connected to a source of potential so as to create a potential well in the substrate beneath the conductive gate.

6. The charge-coupled device of claim 5 in which the first means for transferring charge carriers from the photodetector to the accumulation region comprises a conductive transfer gate extending across the space between the photodetector and the accumulation gate, said transfer gate being adapted to be connected to a potential source to create a potential barrier in the substrate beneath the transfer gate which can control the flow of charge carriers between the photodetector and the accumulation region.

7. The charge-coupled device of claim 6 in which the means for controlling the potential barrier between the photodetector and the first anti-blooming drain region comprises a conductive gate over the surface of the substrate between the photodetector and the first anti-blooming drain region and adapted to be connected to a potential source for creating a potential barrier in the substrate.

8. The charge-coupled device of claim 7 in which the means for controlling the potential barrier between the accumulation region and the second anti-blooming drain region comprises a conductive gate over the surface of the substrate between the accumulation gate and the anti-blooming drain region and adapted to be connected to a potential source for creating a potential barrier in the substrate.

9. The charge-coupled device of claim 8 in which each of the anti-blooming drain regions comprises a region of a conductivity type opposite that of the substrate in the substrate at said major surface and further comprises means whereby the region can be connected to a potential source.

10. The charge-coupled device of claim 9 in which the conductive gate between the accumulation gate and the second anti-blooming drain region extends over and contacts the anti-blooming drain region in the substrate.

11. The charge-coupled device of claim 9 in which the conductive gate of the accumulation region extends over the substrate surface up to the edge of the second anti-blooming drain region in the substrate and further comprising a region of the same conductivity type as the substrate in the substrate beneath the gate at the second anti-blooming drain region.

12. The charge-coupled device of claim 11 in which the accumulation gate contacts the second anti-blooming drain region in the substrate.

13. A charge-coupled device imager comprising:
   a substrate of a semiconductor material having a major surface;
   a plurality of photodetectors in said substrate at said major surface and arranged in spaced relation along a line;
   a first anti-blooming drain region in said substrate adjacent and extending along one side of the line of photodetectors;
   a charged-coupled device shift register at said surface along the side of the line of photodetectors opposite the first anti-blooming drain region;
   a separate accumulation region at said surface between each of said photodetectors and the shift register;

first means for transferring charge carriers from each of said photodetectors to each adjacent accumulation region;

second means for selectively transferring charge carriers from the accumulation regions to the shift register; and a separate second anti-blooming drain region in said substrate at said major surface adjacent each of said accumulation regions.

14. The charge-coupled device of claim 13 in which the second anti-blooming drain regions adjacent the accumulation regions extend across the space between the shift register and the line of photodetectors.

15. The charge-coupled device of claim 14 further comprising:

means between the photodetectors and the adjacent first anti-blooming drain region for controlling the potential barrier in the substrate between the photodetectors and the first anti-blooming drain region; and means between each of the accumulation regions and its adjacent second anti-blooming drain region for controlling the potential barrier in the substrate between each accumulation region and the second anti-blooming drain region.

16. The charge-coupled device of claim 15 wherein:

each of the accumulation regions comprises a conductive gate over and insulated from a portion of the major surface of the substrate between its respective photodetector and the shift register; and further comprising third means for connecting the accumulation gates to a source of potential so as to create a potential well in the substrate beneath each accumulation gate.

17. The charge-coupled device of claim 16 further comprising:

the first means for transferring charge carriers from the photodetectors to the accumulation regions comprises a conductive transfer gate extending over the major surface of the substrate between the photodetectors and the accumulation regions along the entire line of the photodetectors; and means for connecting the transfer gate to a potential source to create a potential barrier in the substrate beneath the transfer gate which can control the flow of charge carriers from the photodetectors to the accumulation regions.

18. The charge-coupled device of claim 17 further comprising:

the means for controlling the potential barrier between the photodetectors and their adjacent first anti-blooming drain regions comprises a conductive gate extending across a space between the photodetectors and the first anti-blooming drain regions along the entire length of the line of photodetectors; and means for connecting the gate to a potential source so as to create a potential barrier in the substrate beneath the gate.

19. The charge-coupled device of claim 18 further comprising:

means for controlling potential barrier between each accumulation region and its respective second anti-blooming drain region comprises a conductive gate extending between the accumulation region gate and the respective second anti-blooming drain region; and means for connecting the gates to a source of potential so as to create a potential barrier in the substrate beneath each gate.

20. The charge-coupled device of claim 19 further comprising:

each of the first and second anti-blooming drain regions includes a region of a conductivity type opposite that of the substrate in the substrate at said surface; and means for connecting the first and second anti-blooming regions to a potential source.

21. The charge-coupled device of claim 20 further comprising:

the charge-coupled device shift register comprises a channel region within the substrate and extending along said surface parallel to and spaced from the line of photodetectors;

a plurality of conductive gates spaced along the channel and insulated from the substrate surface; and the second means for selectively transferring charge carriers from the accumulation regions to the shift register comprises a conductive transfer gate extending between the shift register gates and the accumulation regions along the entire length of the shift register.

22. A solid state imager comprising:

a substrate of semiconductor material having a major surface;

a photodetector in said substrate at said major surface;

a first anti-blooming drain region in said substrate at said major surface in charge transfer relation with said photodetector;

an accumulation region in said substrate at said surface in charge transfer relation with said photodiode but not with said first anti-blooming drain region;

a charge-coupled device shift register in said substrate at said major surface in charge transfer relation with said accumulation region; and a second anti-blooming drain region in said substrate at said major surface in charge transfer relation with said accumulation region but not with said photodetector.

23. The imager of claim 22 further comprising means between the accumulation region and the first anti-blooming drain region for controlling the potential barrier between the accumulation region and the first anti-blooming drain region.

24. The imager of claim 23 further comprising means between the photodetector and the second anti-blooming drain region for controlling the potential barrier between the photodetector and the second anti-blooming drain region.

25. The imager of claim 24 in which the accumulation region comprises a conductive gate over and insulated from a portion of the portion of the major surface between the photodetector and the shift register, said gate being adapted to be connected to a source of potential so as to create a potential well in the substrate beneath the conductive gate.

26. The imager of claim 25 in which each of the anti-blooming drain region comprises a region of a conductivity type opposite that of the substrate in the substrate at said major surface and further comprises means whereby the region can be connected to a potential source.

27. The imager of claim 26 in which the second anti-blooming drain region extends along a side of the accumulation region which extends between the shift register and the photodetector.

28. A charge-coupled imager comprising:
a semiconductor body having a major surface;
a photodetector within the semiconductor body and including a portion of the major surface;
a first anti-blooming drain region within the semiconductor body and along one side of the photodetector;
a charge-coupled device shift register within the semiconductor body and including a portion of the major surface, said register being located along one side of the photodetector and being opposite the first anti-blooming drain region;
an accumulation region within the semiconductor body and including a portion of the major surface, said accumulation region being located between the photodetector and the shift register;
first means for transferring charge carriers from the photodetector to the accumulation region;
second means for transferring charge carriers from the accumulation region to the shift register; and
a second anti-blooming drain region within the semiconductor body and including a portion of the major surface, said second anti-blooming drain region being located along side of the accumulation region.

* * * * *